(12) United States Patent
Yang et al.

(10) Patent No.: US 10,993,332 B2
(45) Date of Patent: Apr. 27, 2021

(54) CIRCUIT SUBSTRATE

(71) Applicant: Unimicron Technology Corp., Taoyuan (TW)

(72) Inventors: Kai-Ming Yang, Hsinchu County (TW); Chen-Hao Lin, Keelung (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/746,968

(22) Filed: Jan. 20, 2020

(65) Prior Publication Data

US 2020/0154578 A1 May 14, 2020

Related U.S. Application Data

(63) Continuation-in-part of application No. 16/152,424, filed on Oct. 5, 2018, now Pat. No. 10,756,050.

(30) Foreign Application Priority Data

Aug. 3, 2018 (TW) .................................. 107127118
Dec. 16, 2019 (TW) .................................. 108146006

(51) Int. Cl.
*H01L 29/40* (2006.01)
*H05K 3/46* (2006.01)
(Continued)

(52) U.S. Cl.
CPC ..... *H05K 3/4644* (2013.01); *H01L 21/76832* (2013.01); *H01L 23/488* (2013.01);
(Continued)

(58) Field of Classification Search
CPC ....... H01L 2924/00; H01L 2224/32225; H01L 2924/00014; H01L 2224/73204;
(Continued)

(56) References Cited

U.S. PATENT DOCUMENTS

| 2015/0187734 A1* | 7/2015 | Liu | ................... H01L 25/0657 257/621 |
| 2017/0110393 A1* | 4/2017 | Tain | ....................... H01L 23/147 |

FOREIGN PATENT DOCUMENTS

| CN | 104752239 | 7/2019 |
| TW | I614864 | 2/2018 |

(Continued)

OTHER PUBLICATIONS

"Office Action of Taiwan Counterpart Application", dated Mar. 23, 2020, p. 1-p. 4.

*Primary Examiner* — Robert G Bachner
(74) *Attorney, Agent, or Firm* — JCIPRNET

(57) ABSTRACT

A circuit substrate includes a substrate, a wire build-up layer structure, and an insulating layer. The substrate has a first surface and a second surface opposites to the first surface. The substrate includes a plurality of patterned pads. The patterned pads are disposed on the first surface of the substrate, and having contact openings. The wire build-up layer structure is disposed on the first surface of the substrate. The wire build-up layer structure includes an interconnect build-up layer and a plurality of conductive pillars. The conductive pillars electrically connect to the interconnect build-up layer and the patterned pads. The insulating layer is disposed between the substrate and the wire build-up layer structure.

8 Claims, 3 Drawing Sheets

(51) Int. Cl.
*H01L 21/768* (2006.01)
*H01L 23/00* (2006.01)
*H01L 23/522* (2006.01)
*H05K 3/32* (2006.01)
*H05K 3/40* (2006.01)
*H01L 23/488* (2006.01)

(52) U.S. Cl.
CPC ............ *H01L 23/522* (2013.01); *H01L 24/02* (2013.01); *H01L 24/13* (2013.01); *H05K 3/32* (2013.01); *H05K 3/40* (2013.01); *H01L 2224/0361* (2013.01); *H01L 2924/201* (2013.01); *H05K 2203/0384* (2013.01)

(58) Field of Classification Search
CPC . H01L 2224/16225; H01L 2924/15311; Y10T 29/49155; Y10T 29/49165; Y10T 29/4913; Y10T 29/49126; Y10T 29/49146; Y10T 156/10; Y10T 29/49124; Y10T 29/49117; Y10T 29/302; Y10T 29/49128; Y10T 29/49156; Y10T 428/12771; Y10T 428/31511; Y10T 428/31551; Y10T 428/31554; Y10T 428/31576; Y10T 428/3158; Y10T 428/31587; Y10T 428/31678; Y10T 428/31931; Y10T 428/31938
See application file for complete search history.

(56) References Cited

FOREIGN PATENT DOCUMENTS

| | | |
|---|---|---|
| TW | I636710 | 9/2018 |
| TW | 201943318 | 11/2019 |

* cited by examiner

CIRCUIT SUBSTRATE

CROSS-REFERENCE TO RELATED APPLICATION

This application is a continuation-in-part application of and claims the priority benefit of U.S. application Ser. No. 16/152,424, filed on Oct. 5, 2018, now pending, which claims the priority benefit of Taiwan application serial no. 107127118, filed on Aug. 3, 2018. This application also claims the priority benefit of Taiwan application serial no. 108146006, filed on Dec. 16, 2019. The entirety of each of the above-mentioned patent applications is hereby incorporated by reference herein and made a part of this specification.

BACKGROUND

Technical Field

The present invention relates to a substrate, and more particularly to a circuit substrate.

Description of Related Art

With the evolution of semiconductor packaging technology, different package types have been developed for semiconductor devices, such as wire bonding, flip chip or hybrid (i.e., flip chip together with wire bonding) packaging techniques.

The above-mentioned bonding techniques, with use of solder balls or bumps, use solder materials for bonding, and may encounter problems like bonding surface separation due to long-term fatigue, reliability issue caused by the defective solder balls during the manufacturing process, and relatively high resistance on contact points.

SUMMARY

The present invention provides a circuit substrate, which is suitable for low temperature bonding and assembly, has excellent bonding reliability and bonding quality, and has excellent electrical characteristics.

The circuit substrate of the present invention includes a substrate, a wire build-up layer structure and an insulating layer. The substrate has a first surface and a second surface opposite to the first surface. The substrate includes a plurality of patterned pads disposed on the first surface of the substrate. Each of the patterned pads has a contact opening. The wire build-up layer structure is disposed on the first surface of the substrate, and the wire build-up layer structure includes an interconnect build-up layer and a plurality of conductive pillars. The conductive pillars are electrically connected to the interconnect build-up layer and the patterned pads. The insulating layer is disposed between the substrate and the wire build-up layer structure.

In an embodiment of the present invention, each of the conductive pillars correspondingly abuts each of the contact openings.

In an embodiment of the present invention, a wall surface of the contact opening is an inclined surface, and a diameter of the contact opening away from the first surface is larger than a diameter of the contact opening adjacent to the first surface.

In an embodiment of the present invention, each of the patterned pads further includes a patterned metal layer, the contact opening is disposed on the patterned metal layer, and a depth of the contact opening is smaller than a thickness of the patterned metal layer.

In an embodiment of the present invention, each of the patterned pads further includes a patterned metal layer, the contact opening is disposed on the patterned metal layer, and the contact opening penetrating through a thickness of the patterned metal layer and exposing the first surface of the substrate.

In an embodiment of the present invention, each of the conductive pillars correspondingly abuts each of the contact openings and contacts the first surface.

In an embodiment of the present invention, the circuit substrate further includes a plurality of etch stop layers disposed on the first surface. Each of the patterned pads is disposed corresponding to each of the etch stop layers, and each of the etch stop layers is disposed between each of the patterned pads and the substrate.

In an embodiment of the present invention, each of the patterned pads further includes a patterned metal layer. The contact opening is disposed on the patterned metal layer, and the contact opening penetrating through a thickness of the patterned metal layer and exposing the etch stop layer.

In an embodiment of the present invention, each of the conductive pillars correspondingly abuts each of the contact openings and contacts the etch stop layer.

In an embodiment of the present invention, the insulating layer surrounds the conductive pillars and filling in gaps between the conductive pillars, and the insulating layer covers the patterned pad.

Based on the above, since the circuit substrate of the present invention may directly form the contact openings on the patterned pads, thus an additional dielectric layer may be omitted to simplify the manufacturing process and may reduce costs. In addition, since a stress concentration point is generated between the conductive pillar and the wall surface of the contact opening of the embodiment, thus the embodiment may effectively reduce the laminating temperature and reduce the pressing force required for bonding. Therefore, the present invention may meet the requirement for copper-to-copper bonding, and is suitable for reducing the requirements of manufacturing processes and manufacturing costs. The present invention may also improve the reliability and quality of bonding between the conductive pillars and the patterned pads. Additionally, the present invention exhibits excellent electrical characteristics and thereby improving the signal transmission speed and quality of the circuit substrate. Furthermore, the insulating layer disposed between the substrate and the wire build-up layer structure may, in addition to improve bonding strength, also protect the conductive pillars and the patterned pads from the influence of moisture in the environment. The circuit substrate further having excellent elasticity and flexibility, thus may absorb stress to improve the impact resistance of the circuit substrate, and may further enhance the bonding reliability and quality of the circuit substrate.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Some embodiments are provided hereinafter and described in detail with reference to figures. However, the embodiments provided are not intended to limit the scope of the invention. Moreover, the figures are only descriptive and are not drawn to scale. For ease of explanation, the same devices below are provided with the same reference symbols.

Moreover, terms such as "first" and "second" used herein do not represent order, and it should be understood that they are for differentiating devices or operations having the same technical terms.

Secondly, the terms "containing", "including", "having" and the like as used herein are all open-ended terms; i.e., including but not limited to.

Furthermore, the terms "in contact with", "connected to", "bonded to" and the like, as used herein, may mean direct contact or indirect contact via other layers unless otherwise stated.

Figure 1A:
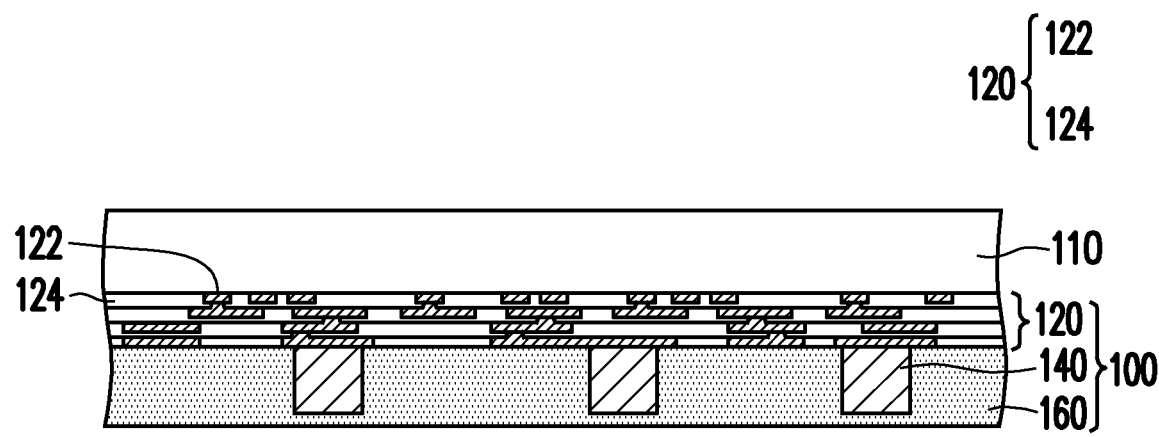
FIG. 1A to FIG. 1D are schematic cross-sectional views illustrating a manufacturing process of a circuit substrate according to an embodiment of the present invention.

FIG. 1A to FIG. 1D are schematic cross-sectional views of a manufacturing process of a circuit substrate according to an embodiment of the present invention. Please first refer to FIG. 1D, which is a schematic cross-sectional view of a circuit substrate 10 according to an embodiment of the present invention. The circuit substrate 10 includes a substrate 200, a wire build-up layer structure 100, and an insulation layer 160 disposed between the substrate 200 and the wire build-up layer structure 100. In the embodiment, the wire build-up layer structure 100 includes a plurality of conductive pillars 140, and the conductive pillars 140 are electrically connected to a plurality of patterned pads 240 on the substrate 200. In this way, the reliability and quality of the bonding between the substrate 200 and the wire build-up layer structure 100 may be improved, and the circuit substrate 10 may have excellent electrical characteristics. The following description will briefly explain the manufacturing process of the circuit substrate 10 according to an embodiment Please refer to FIG. 1A. FIG. 1A is a schematic cross-sectional view of the wire build-up layer structure 100 of the present invention. First, a carrier board 110 is provided. The materials of the carrier board 110 may include glass, ceramic, polymer material or silicon. For example, the materials of the carrier board 110 may be poly-silicon, silicon carbide (SiC), graphene, aluminum nitride (AlN) or other suitable materials, but the invention is not limited thereto.

Next, a plurality of interconnects 122 and a plurality of dielectric layers 124 are formed on the carrier board 110. In some embodiments, before the step of forming the interconnects 122 and the dielectric layers 124, a release film may be formed on the carrier board 110 first, and then the interconnects 122 and the dielectric layers 124 may be formed on the release film.

In the embodiment, layers of the interconnects 122 and layers of the dielectric layers 124 may be stacked alternately to form a multilayered interconnect build-up layer 120. From another perspective, the interconnect build-up layer 120 may be a redistribution layer (RDL), and is a multilayered circuits formed by the dielectric layers 124, the patterned interconnects 122 disposed on opposite sides of the dielectric layers 124, and conductive holes (not labeled) penetrating through the dielectric layers 124 and connected to the patterned interconnects 122. The interconnect build-up layer 120 may also be a single-layered circuit or a multilayered circuit with other configurations, but the present invention is not limited thereto. It should be noted that, FIG. 1A only schematically illustrates a four-layers interconnect build-up layer 120 in which four layers of the interconnects 122 and four layers of the dielectric layers 124 are alternately stacked, but the structure of FIG. 1A is not intended to limit the present invention. In other embodiments, the interconnect build-up layer 120 may optionally include one, two, three, five or more layers of the interconnects and the dielectric layers.

In the embodiment, based on considerations of conductivity, the materials of the interconnect 122 include a metallic material, a metal nitride, a metal silicide, or a combination thereof. The metallic material may be, for example, titanium, copper, nickel, palladium, gold, silver, or an alloy thereof, but the present invention is not limited thereto. The method of forming the interconnect 122 includes a physical vapor deposition method, a chemical vapor deposition method, an electroplating process, or an electroless plating process. The physical vapor deposition method may be, for example, a sputtering method or an evaporation method, but the invention is not limited thereto.

In the embodiment, the materials of the dielectric layer 124 include an inorganic material (for example, silicon oxide, silicon nitride, silicon oxynitride, other suitable materials, or a stacked layer of at least two of the above-mentioned materials), an organic material (for example, polyimide (PI), polybenzoxazole (PBO), siliconone, epoxy, benzocyclobutene (BCB), or a stack layer having at least two of the above-mentioned materials), or other suitable materials, or a combination thereof, the invention is not limited thereto.

Referring to FIG. 1A, then a plurality of conductive pillars 140 are formed on the interconnect build-up layer 120. In the embodiment, the conductive pillars 140 are disposed on the interconnect 122 and electrically connecting the interconnect 122 of the interconnect build-up layer 120. The conductive pillars 140 may be plated bumps or etched bumps. The materials of the conductive pillars 140 may be the same as or different from the interconnects 122, including a metallic material. The metallic material may be, for example, titanium, copper, nickel, palladium, gold, silver, or an alloy thereof, but the invention is not limited thereto. The method of forming the conductive pillars 140 may include the following steps: first forming a layer of conductive material on the interconnect build-up layer 120, and then patterning the layer of conductive material to form the conductive pillars 140 through lithography. The conductive pillars 140 are electrically connected to the interconnect 122, but the invention is not limited thereto. In the embodiment, the diameter of any one of the conductive pillars 140 may be 5 micrometers (μm) to 60 micrometers (μm), and the height of any one of the conductive pillars 140 may be 5 micrometers to 35 micrometers, but the invention is not limit thereto. In the embodiment, the height of the conductive pillar 140 may be defined as the maximum distance extending along a normal direction from the interface, where the conductive pillar 140 contacting the interconnect build-up layer 120, to the surface of the conductive pillar 140 furthest away from the interconnect build-up layer 120.

In the embodiment, an insulating layer 160 may then be disposed on the interconnect build-up layer 120 to cover the conductive pillars 140 and the interconnect build-up layer 120. In the embodiment, the materials of the insulating layer 160 include an organic material or an inorganic material. For example, the materials may include epoxy resin, acrylic resin, polyimide (PI), polybenzoxazole (PBO), siliconone, benzocyclobutene (BCB), or other suitable materials, but the invention is not limited thereto. The insulating layer 160 may be used as a passivation layer to protect the interconnect build-up layer 120 and the conductive pillars 140. Specifically, the insulating layer 160 may improve the protection for the interconnect build-up layer 120 and the conductive pillars 140 against moisture and oxygen in the environment. In addition, the insulating layer 160 may also contribute to the bonding for the subsequent wire build-up layer structure 100 fixing to the substrate 200, and improve the bonding quality and reliability of the circuit substrate 10.

In the embodiment, the insulating layer 160 may completely cover the conductive pillars 140. That is, the thickness of the insulating layer 160 disposed on the wire build-up layer structure 100 may be greater than the thickness of the conductive pillar 140, but the invention is not limited thereto. In some embodiments, the thickness of the insulating layer 160 may also be equal to or less than the thickness of the conductive pillar 140.

In other embodiments, the insulating layer 160 may also be disposed on the substrate 200 to protect the circuits or pads on the substrate 200, but the invention is not limited thereto.

Figure 1B:
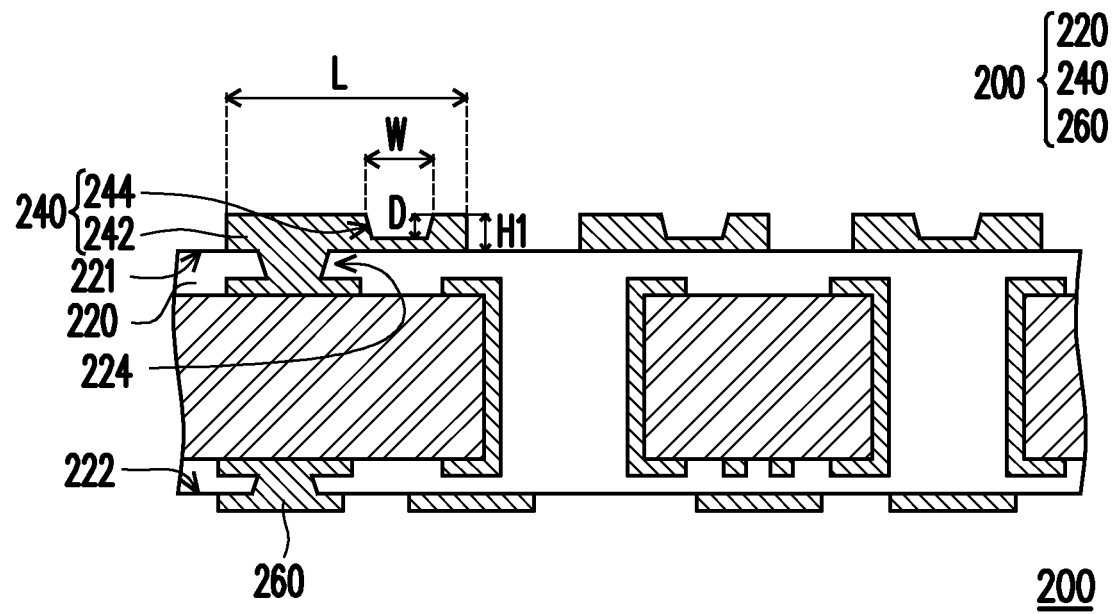

Referring to FIG. 1B, which is a schematic cross-sectional view of a substrate 200 of the present invention. In the embodiment, the substrate 200 is, for example, an organic substrate having a redistribution layer, and includes an outer dielectric layer 220 and a plurality of patterned pads 240 disposed on the outer dielectric layer 220, or a plurality of terminals 260 disposed on the outer dielectric layer 220, but the invention is not limited to. In some embodiments, the substrate 200 may also be a coreless substrate, a printed circuit board (PCB), an any-layer printed circuit board, or a substrate applying the technologies of a high-density interconnect (HDI), but the invention is not limited thereto.

In the embodiment, the substrate 200 includes a core substrate or a coreless substrate, and may also be an insulating substrate, a flexible substrate, a glass substrate, or a combination thereof, and the invention is not limited thereto. The outer dielectric layer 220 may be a PrePreg or other suitable dielectric materials, and the invention is not limited thereto.

As shown in FIG. 1B, the substrate 200 (or the outer dielectric layer 220) has a first surface 221 and a second surface 222 opposite to the first surface 221. In the embodiment, a plurality of patterned pads 240 are disposed on the first surface 221 of the substrate 200. In the embodiment, the patterned pads 240 may be a part of signal wires on the outer dielectric layer 220, but the invention is not limited thereto. In some embodiments, the patterned pads 240 may also be disposed separately from the signal wires, but are connected to each other. In addition, a plurality of terminals 260 are disposed on the second surface 222 of the substrate 200. In the embodiment, vias 224 may be selectively formed in the outer dielectric layer 220 to connect the patterned pads 240 on the first surface 221 of the substrate 200 and the internal circuits of the substrate 200 to each other, but the invention is not limited thereto. The method of forming the above-mentioned vias 224 includes lithography, mechanical drilling, laser drilling, or other suitable methods, and the invention is not limited thereto.

In the embodiment, the materials of the patterned pads 240 and the terminals 260 may be, for example, titanium, copper, nickel, palladium, gold, silver, or an alloy thereof, but the invention is not limited thereto.

It is worth noting that, the patterned pad 240 of the embodiment has a contact opening 244. Specifically, the patterned pad 240 includes a patterned metal layer 242 and a contact opening 244 disposed on the patterned metal layer 242. In the embodiment, the method of forming the patterned pad 240 may include: first forming a metal material layer (not shown); then disposing a photoresist layer on the metal material layer; and then developing the photoresist layer. Afterwards, the metal material layer is etched through a metal etchant. The metal etchant includes, for example, a mixture of sulfuric acid and hydrogen peroxide ($H_2SO_4$+$H_2O_2$), ferric chloride ($FeCl_3$), ammonium cupric chloride dihydrate ($H_8ClCuNO_2$), copper chloride ($CuCl_2$), hydrofluoric acid (HF), and diluted hydrofluoric acid (DHF) or buffered oxide etchant (BOE), but the invention is not limited thereto. In this way, the pattern of the photoresist layer may be transferred to the metal material layer, and then the patterned metal layer 242 and the contact openings 244 on the patterned metal layer 242 may be directly formed. Thus, the manufacturing process may be simplified and reduced the costs.

In some embodiments, the patterned pads 240 with the contact openings 244 may also be directly formed. In other embodiments, after the patterned metal layer 242 is formed, the contact opening 244 may be formed through laser drilling or mechanical drilling.

In the embodiment, the patterned pad 240 (or the patterned metal layer 242) may meet the requirements of fine pitch. For example, the length L of the patterned pad 240 may be 15 µm to 80 µm, but the invention is not limited thereto. In some embodiments, the length L may be 40 µm to 60 µm, or 60 µm to 80 µm. In the embodiment, the length L may be defined as the maximum length of the patterned pad 240 extending along the first surface 221.

In the embodiment, the thickness H1 of the patterned pad 240 (or the patterned metal layer 242) may be 5 µm to 35 µm, but the invention is not limited thereto. In some embodiments, the thickness H1 may be 6 µm to 10 µm, or 10 µm to 18 µm. In this embodiment, the thickness H1 may be defined as the maximum thickness of the patterned pad 240 on the first surface 221 along the vertical direction of the substrate 200.

In the embodiment, the diameter of the contact opening 244 away from the first surface 221 is larger than the diameter of the contact opening 244 adjacent to the first surface 221. For example, the diameter and/or the aperture of the contact opening 244 away from the first surface 221 gradually decreases toward the vicinity of the first surface 221, so that the wall surface of the contact opening 244 is an inclined surface. An angle exists between the wall surface and the bottom surface of the contact opening 244. In the embodiment, the angle may be 0 degree to 90 degrees, but the invention is not limited thereto. In some embodiments, the angle may be 30 degrees or 60 degrees.

In the embodiment, the diameter and/or the aperture of the contact opening 244 away from the first surface 221 may have a width W. The width W may be 5 μm to 60 μm, but the invention is not limited thereto. In some embodiments, the width W may be 10 μm to 15 μm, or 15 μm to 30 μm. In the embodiment, the width W may be defined as the maximum width of the diameter and/or the aperture of the contact opening 244 furthest away from the first surface 221.

In the embodiment, the depth D of the contact opening 244 may be 5 μm to 35 μm, but the invention is not limited thereto. In some embodiments, the depth D may be 6 μm to 10 μm, or 10 μm to 18 μm. In the embodiment, the depth D may be defined as the maximum depth of the contact opening 244 on the first surface 221, in the vertical direction of the substrate 200. In the embodiment, the depth D may be smaller than the thickness H1 of the patterned pad 240 (or the patterned metal layer 242). That is, the contact opening 244 does not penetrate through the patterned metal layer 242, and instead forms a groove with an appropriate depth on the patterned metal layer 242.

In some embodiments, the height (not labeled) of the conductive pillar 140 may be greater than or equal to the depth D of the contact opening 244, but the invention is not limited thereto.

In the embodiment, the shape of the contact opening 244 in a plan view is not particularly limited, and may be triangular, rectangular, polygonal, circular, oval, or irregular. The shape of the contact opening 244 in a cross-sectional view may be tapered or bowl-shaped, but the invention is not limited thereto.

In the embodiment, after the contact opening 244 is formed, the substrate 200 may be selectively cleaned to remove possible impurities or dust, so as to further improve the reliability and quality of subsequent bonding.

Figure 1C:
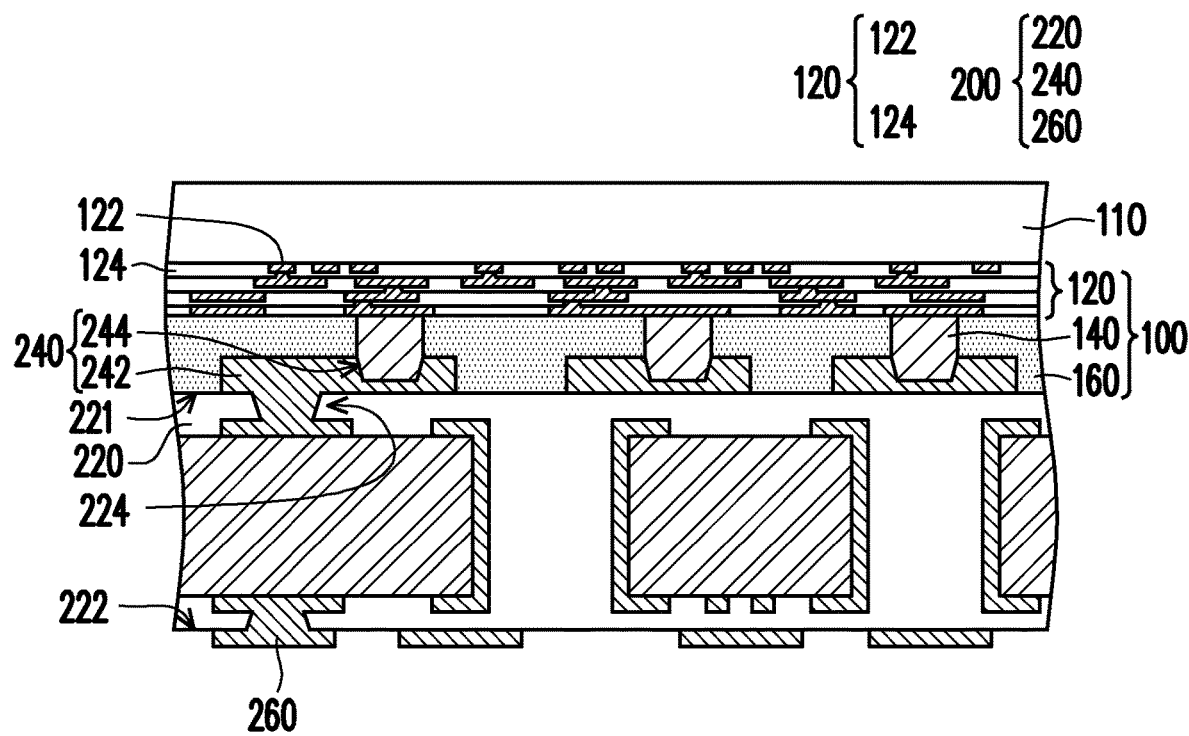

Referring to FIG. 1C, then the wire build-up layer structure 100 is pressed and laminated onto the substrate 200. For example, the wire build-up layer structure 100 may be pressed and disposed on the first surface 221 of the substrate 200. The conductive pillars 140 of the wire build-up layer structure 100 correspond to the patterned pads 240 on the first surface 221, and each of the conductive pillars 140 correspondingly abuts each of the contact openings 244. In the embodiment, the conductive pillar 140 may fill in the contact opening 244 through thermal pressing and lamination. In this way, the conductive pillars 140, which are between the interconnect build-up layer 120 and the patterned pads 240, may be electrically connected to the patterned pads 240 in order to electrically connect the wire build-up layer structure 100 to the wires and pads of the substrate 200.

In the embodiment, the materials of the conductive pillar 140 and the patterned pad 240 may be the same, such as titanium, copper, nickel, palladium, gold, silver, or an alloy thereof, but the invention is not limited thereto.

Referring to FIG. 1C. In the step of pressing and laminating the wire build-up layer structure 100 to the substrate 200, the insulation layer 160 is also pressed and laminated to the substrate 200. In the above-mentioned step, pressing the conductive pillars 140 to the patterned pads 240 and the contact openings 244 may push away the insulating layer 160 covering the conductive pillars 140 without affecting the conductive pillars 140 abutting the contact openings 244. In addition, the insulating layer 160 may be disposed between the substrate 200 and the wire build-up layer structure 100. The insulating layer 160 surrounds the conductive pillars 140 and filling in the gaps between the conductive pillars 140. In addition, the insulating layer 160 may further cover the patterned pads 240. In this way, the insulating layer 160 may securely fix the wire build-up layer structure 100 to the substrate 200, and further improve the bonding reliability and bonding quality between the conductive pillars 140 and the patterned pads 240, so that the circuit substrate 10 has excellent electrical characteristics. In addition, the insulating layer 160 may further protect the conductive pillars 140 and the patterned pads 240 from moisture in the environment. The insulating layer 160 also has good elasticity and flexibility, and may absorb stress to improve the impact resistance of the circuit substrate 10, thus further improving the reliability and quality of the bonding.

Figure 1D:
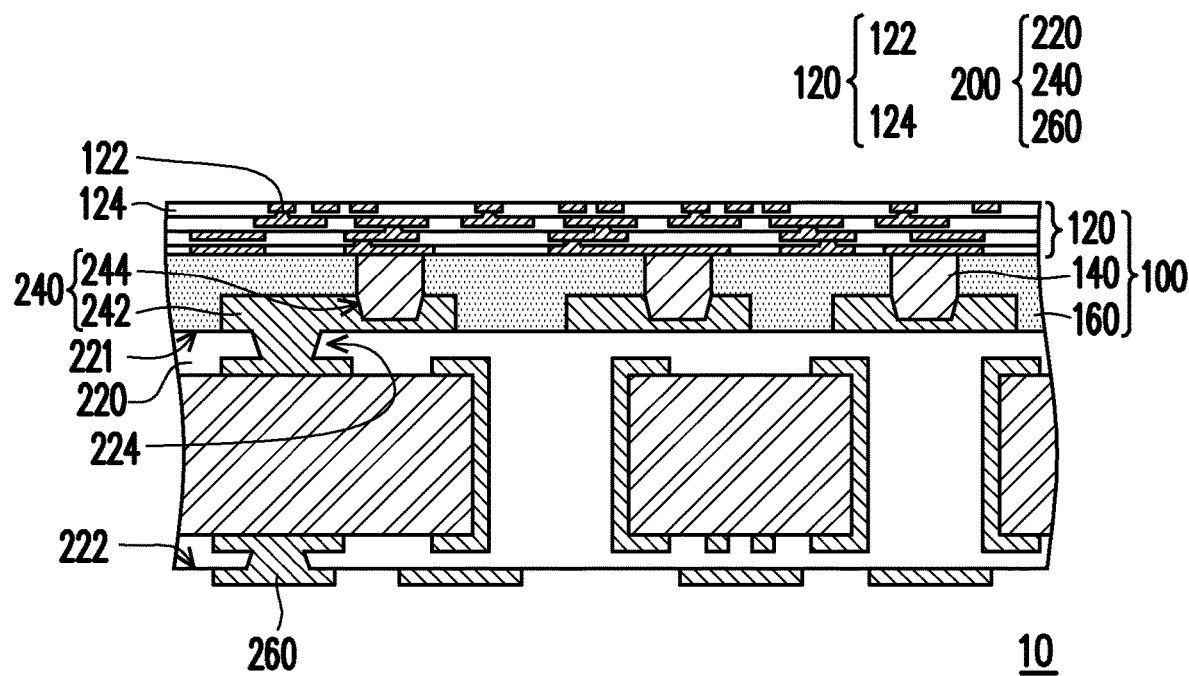

Referring to FIG. 1C and FIG. 1D. The carrier board 110 is removed. In the embodiment, the method for removing the carrier board 110 includes, for example, debonding the carrier board 110 from the wire build-up layer structure 100 by light irradiation, heating, applying a mechanical force (for example, peeling), or by laser dissociation. At this point, the manufacturing process of the circuit substrate 10 has been completed.

It is worth noting that, since the circuit substrate 10 according to the embodiment of the present invention may have the contact openings 244 to be directly formed on the patterned metal layer 242 of the patterned pad 240, an additional dielectric layer disposed on the patterned metal layer 242 may be omitted. Furthermore, the step of forming an opening to expose the patterned metal layer 242 may also be omitted, thus may simplify the manufacturing process and reduce the cost.

In addition, since the wall surface of the contact opening 244 is an inclined surface, during the pressing and/or lamination step, the metal-to-metal bonding process may be performed under a normal pressure environment at a lamination temperature equal to 200° C. or less. Specifically, when the conductive pillar 140 is a conductive copper pillar and the patterned pad 240 is a copper pad, and after the conductive pillar 140 contacts the inclined copper sidewall of the contact opening 244, a stress concentration point is created between the copper pillar 140 and the inclined sidewall of the contact opening 244. Thus, the embodiment may effectively reduce the laminating temperature and reduce the pressing force required for bonding. In addition, the surface of the conductive pillar 140 does not need to be cleaned before bonding, and it is also not necessary to flatten and/or polish the surface of the conductive pillar 140 through chemical mechanical polishing process. In addition, after bonding, the circuit substrate 10 does not need to undergo additional annealing treatment. Therefore, the copper-to-copper bonding method shown in the embodiment is suitable for reducing manufacturing process requirements and manufacturing costs, and may also meet the copper-to-copper bonding requirement. Thus the bonding reliability and bonding quality between the conductive pillar 140 and the patterned pad 240 may be improved. The circuit substrate 10 may also have good elasticity and flexibility, and has excellent electrical characteristics to improve the signal transmission speed and quality of the circuit substrate 10.

It should be noted that the reference symbols and a part of the contents in the previous embodiment are used in the following embodiments, in which identical reference symbols indicate identical or similar devices. The part of the description with the identical technical content omitted may refer to the foregoing embodiment, which is not repeated in the following description.

Figure 2:
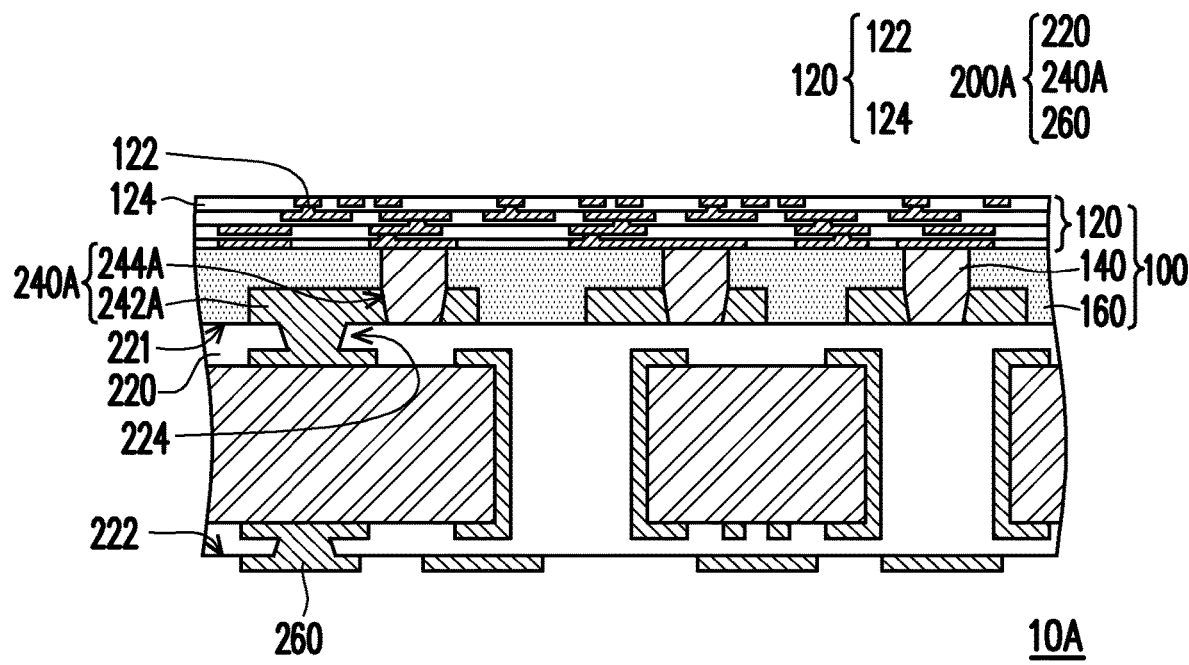
FIG. 2 is a schematic cross-sectional view of a circuit substrate according to another embodiment of the present invention.

FIG. 2 is a schematic cross-sectional view of a circuit substrate according to another embodiment of the present invention. Referring to FIG. 1D and FIG. 2. The circuit substrate 10A of the embodiment is similar to the circuit substrate 10 of FIG. 1D. The main difference is that the patterned pad 240A of the circuit substrate 10A includes a patterned metal layer 242A and a contact opening 244A. The contact opening 244A is disposed on the patterned metal layer 242A, and the contact opening 244A penetrating through the thickness of the patterned metal layer 242A and exposing the first surface 221 of the substrate 200A. That is, the depth of the contact opening 244A may be equal to the thickness of the patterned metal layer 242A.

Under the above arrangement, the conductive pillar 140 correspondingly abuts the contact opening 244A may contact the first surface 221. In this way, the manufacturing process of forming the contact opening 244A may be simplified, the demand for thinning may be further achieved, and the same effect as that of the above embodiment may be obtained.

Figure 3:
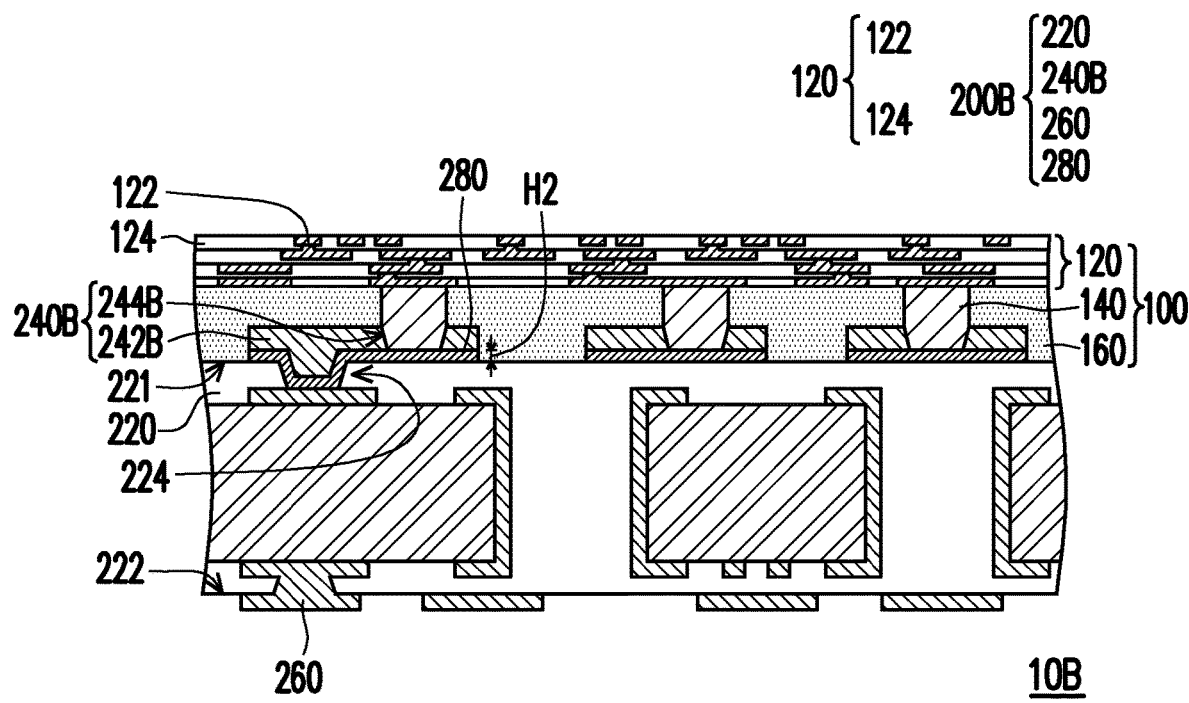
FIG. 3 is a schematic cross-sectional view of a circuit substrate according to yet another embodiment of the present invention.

FIG. 3 is a schematic cross-sectional view of a circuit substrate according to yet another embodiment of the present invention. Referring to FIG. 1D and FIG. 3. The circuit substrate 10B of the embodiment is similar to the circuit substrate 10 of FIG. 1D. The main difference is that the circuit substrate 10B further includes a plurality of etch stop layers 280 disposed on the first surface 221 of the substrate 200B. The etch stop layer 280 is disposed corresponding to the patterned pad 240B (or the patterned metal layer 242B), and vice versa. Specifically, before the step of forming the patterned pad 240B, an etch stop material (not shown) may first be formed on the first surface 221, and then the etch stop material is patterned through a lithography process to form the etch stop layer 280. In this embodiment, the etch stop layer 280 may be conformally disposed in the via 224 on the first surface 221 of the substrate 200B.

In the embodiment, the materials of the etch stop layer 280 include titanium, tin, molybdenum, aluminum, or other suitable materials, and the invention is not limited thereto. In the embodiment, the thickness H2 of the etch stop layer 280 may be 5 nanometers (nm) to 100 nanometers (nm), but the invention is not limited thereto. In some embodiments, the thickness H2 may be 5 nm to 10 nm, or 10 nm to 20 nm. In the embodiment, the thickness H2 may be defined as the maximum thickness of the etch stop layer 280 on the first surface 221 along the vertical direction of the substrate 200.

Next, the patterned pads 240B are correspondingly disposed on the etch stop layer 280. For example, the patterned metal layer 242B is disposed on the etch stop layer 280, and then the contact opening 244B is formed on the patterned metal layer 242B. In some embodiments, the edges of the patterned metal layer 242B are aligned with the etch stop layer 280, but the invention is not limited thereto. Under the above arrangement, the etch stop layer 280 is disposed between the patterned pad 240B (or the patterned metal layer 242B) and the substrate 200. In the embodiment, the thickness of the patterned pad 240B may be greater than the thickness H2 of the etch stop layer 280, but the invention is not limited thereto. In some embodiments, the thickness of the patterned pad 240B may also be equal to or less than the thickness H2 of the etch stop layer 280.

In the embodiment, the orthographic projection of the contact opening 244B in the vertical direction of the substrate 200 does not overlap with the orthographic projection of the via 224 in the vertical direction of the substrate 200, but the invention is not limited thereto.

In the embodiment, the contact opening 244B may penetrate through the thickness of the patterned metal layer 242B, and expose the etch stop layer 280. That is, the depth of the contact opening 244B may be equal to the thickness of the patterned metal layer 242B. Under the above arrangement, during the step of developing and etching the patterned metal layer 242B, the influence of the etchant on the substrate 200 may be reduced by the etch stop layer 280. In this way, the influence of the manufacturing process on the substrate 200 may be reduced, and the patterned pad 240B may be formed on the substantially flat etch stop layer 28. Thus, the subsequent bonding of the contact openings 244B to the conductive pillars 140 may be reliable, thereby further improving the quality of circuit substrate 10B.

In the embodiment, the conductive pillar 140 correspondingly abuts the contact opening 244B, and the conductive pillar 140 may contact the etch stop layer 280. In this way, in addition to simplifying the manufacturing process and protecting the substrate 200, the circuit substrate 10B may also improve the reliability and quality of the bonding through the etch stop layer 280. The circuit substrate 10B may also have good electrical characteristics. In addition, the circuit board 10B may also obtain the same effects as that of the above embodiment.

In summary, since the circuit substrate according to an embodiment of the present invention may directly form the contact openings on the patterned pads, thus an additional dielectric layer may be omitted to simplify the manufacturing process and may reduce costs. In addition, since the wall surface of the contact opening is an inclined surface, lamination process and copper-to-copper bonding process may be proceeded under normal pressure and low temperature (temperature less than or equal to 200° C.). After the conductive pillar of the embodiment contacts the inclined surface of the contact opening, a stress concentration point is generated between the conductive pillar and the wall surface of the contact opening, so the temperature of the lamination may be effectively reduced, and the pressing force required for bonding may be reduced. Therefore, the copper-to-copper bonding method shown in the embodiment is suitable for reducing the requirements of manufacturing process, and manufacturing costs, and may also meet the requirement of copper-to-copper bonding. The present invention also improves the reliability and quality of the boding between the conductive pillars and the patterned pads. The circuit substrate of the present invention also has good elasticity and flexibility, and further has excellent electrical characteristics, thereby improving the signal transmission speed and quality of the circuit board.

In addition, the insulating layer disposed between the substrate and the wire build-up layer structure may not only improve the bonding strength, but also surround the conductive pillars and cover the patterned pads. In this way, the insulating layer may protect the conductive pillars and the patterned pads from the influence of moisture in the environment, and has good elasticity and flexibility, so as to absorb stress and improve the impact resistance of the circuit substrate, thereby further enhancing the bonding reliability and quality of the circuit substrate.

Furthermore, the circuit substrate may also reduce the influence of the etchant process on the substrate by the etch stop layer, and may also flatten the patterned pads, so as to improve the bonding reliability and quality between the contact opening and the conductive pillar. Thereby, the circuit substrate has excellent quality and electrical characteristics.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A circuit substrate, comprising:
    a substrate having a first surface and a second surface opposite to the first surface, the substrate comprising:
        a plurality of patterned pads disposed on the first surface of the substrate, and each of the patterned pads has a contact opening, wherein a wall surface of the contact opening is an inclined surface, and a diameter of the contact opening away from the first surface is larger than a diameter of the contact opening adjacent to the first surface;
    a wire build-up layer structure disposed on the first surface of the substrate, the wire build-up layer structure comprising:
        an interconnect build-up layer; and
        a plurality of conductive pillars, the conductive pillars electrically connecting the interconnect build-up layer and the patterned pads, wherein each of the conductive pillars correspondingly abuts the inclined surface of the wall surface of each of the contact openings; and
    an insulating layer disposed between the substrate and the wire build-up layer structure.

2. The circuit substrate according to claim 1, wherein each of the patterned pads further comprising a patterned metal layer, the contact opening is disposed on the patterned metal layer, and a depth of the contact opening is less than a thickness of the patterned metal layer.

3. The circuit substrate according to claim 1, wherein each of the patterned pads further comprising a patterned metal layer, the contact opening is disposed on the patterned metal layer, and the contact opening penetrating through a thickness of the patterned metal layer and exposing the first surface of the substrate.

4. The circuit substrate according to claim 3, wherein each of the conductive pillars correspondingly abuts each of the contact openings and contacting the first surface.

5. The circuit substrate according to claim 1, further comprising a plurality of etch stop layers disposed on the first surface, each of the patterned pads is disposed correspondingly to each of the etch stop layers, and each of the etch stop layers is disposed between each of the patterned pads and the substrate.

6. The circuit substrate according to claim 5, wherein each of the patterned pads further comprising a patterned metal layer, the contact opening is disposed on the patterned metal layer, and the contact opening penetrating through a thickness of the patterned metal layer and exposing the etch stop layer.

7. The circuit substrate according to claim 5, wherein each of the conductive pillars correspondingly abuts each of the contact openings and contacting the etch stop layer.

8. The circuit substrate according to claim 1, wherein the insulating layer surrounds the conductive pillars and filling in gaps between the conductive pillars, and the insulating layer covers the patterned pads.

* * * * *